United States Patent
Wang et al.

(10) Patent No.: US 10,056,134 B2
(45) Date of Patent: Aug. 21, 2018

(54) TERNARY 2-9 LINE ADDRESS DECODER REALIZED BY CNFET

(71) Applicant: Ningbo University, Zhejiang (CN)

(72) Inventors: Pengjun Wang, Zhejiang (CN); Daohui Gong, Zhejiang (CN); Yuejun Zhang, Zhejiang (CN); Yaopeng Kang, Zhejiang (CN)

(73) Assignee: Ningbo University, Zhejiang (CN)

( * ) Notice: Subject to any disclaimer, the term of this patent is extended or adjusted under 35 U.S.C. 154(b) by 0 days.

(21) Appl. No.: 15/687,548

(22) Filed: Aug. 28, 2017

(65) Prior Publication Data

US 2018/0182450 A1 Jun. 28, 2018

(30) Foreign Application Priority Data

Dec. 23, 2016 (CN) .......................... 2016 1 1202797

(51) Int. Cl.
*G11C 11/418* (2006.01)
(52) U.S. Cl.
CPC ................................. *G11C 11/418* (2013.01)
(58) Field of Classification Search
None
See application file for complete search history.

(56) References Cited

U.S. PATENT DOCUMENTS 6,133,754 A * 10/2000 Olson ................ H03K 19/0008
326/112

OTHER PUBLICATIONS

Deng et al., "A Compact SPICE Model for Carbon-Nanotube Field-Effect Transistors Including Nonidealities and Its Application—Part I: Model of the Intrinsic Channel Region," IEEE Transactions on Electron Devices, Dec. 2007, pp. 3186-3194.

(Continued)

*Primary Examiner* — James G Norman
(74) *Attorney, Agent, or Firm* — JCIPRNET

(57) ABSTRACT

The present invention discloses a ternary 2-9 line address decoder realized by CNFET, comprising two ternary 1-3 line address decoders of the same structure, nine three-input NAND gates of the same structure and nine inverters of the same structure; the ternary 1-3 line address decoder comprises a $1^{st}$ CNFET transistor, a $2^{nd}$ CNFET transistor, a $3^{rd}$ CNFET transistor, a $4^{th}$ CNFET transistor, a $5^{th}$ CNFET transistor, a $6^{th}$ CNFET transistor, a $7^{th}$ CNFET transistor, an $8^{th}$ CNFET transistor, a $9^{th}$ CNFET transistor, a $10^{th}$ CNFET transistor and an $11^{th}$ CNFET transistor; as compared with a 3-8 line address decoder, it features in limited deviation to an output terminals and significant reduction in the number of input terminals, which can minimize the number of ports as packaging, and improve decoding efficiency; furthermore, it is realized by CNFET, which features in low power consumption and less postponement.

8 Claims, 5 Drawing Sheets

(56) References Cited

OTHER PUBLICATIONS

Mishra et al., "Novel Design Technique of Address Decoder for SRAM," 2014 International Conference on Advanced Communication Control and Computing Technologies (ICACCCT), May 2014, pp. 1-4.

* cited by examiner

TERNARY 2-9 LINE ADDRESS DECODER REALIZED BY CNFET

CROSS-REFERENCE TO RELATED APPLICATION

This application claims the priority benefit of China application no. 201611202797.9, filed on Dec. 23, 2016. The entirety of the above-mentioned patent application is hereby incorporated by reference herein and made a part of this specification.

FIELD OF THE INVENTION

The present invention is related to a 2-9 line address decoder, in particular to a ternary 2-9 line address decoder realized by Carbon Nanotube Field Effect Transistor (CNFET).

BACKGROUND ART

The Static Random Access Memory (SRAM) features in quick-write speed, which is normally used as the interface circuit between the processor and memory as well as high-speed buffer memory of the processor. Development of Very Large Scale Integration (VLSI) and increase in clock frequency of the processor has put forward higher requirements for read-write speed of SRAM. As an important part of SRAM, postponement of address decoder accounts for the majority of postponement of SRAM read-write; therefore, SRAM read-write speed and power consumption are closely associated with the performance of address decoder. Design of high-performance address decoder plays an important role in improvement of SRAM read-write speed, and reduction of power consumption.

Conventional address decoder makes use of CMOS technology for design; accompanied by reduction of feature size to the nanometer scale, such problems as gate delay resulted from interconnect parasitic effect and interconnect crosstalk have become more and more serious; working speed of address decoder is confronted with great challenges. On the contrary, the quasi-one-dimension Carbon Nanotube (CNT) is likely to substitute CMOS process owing to such features as ballistic transmission, stable chemical properties and easy regulation of grid voltage. It is applicable to obtain the Carbon Nanotube Field Effect Transistor (CNFET) by using CNTs as conducting channel. According to study of Literature: DENG J, WONG H S P. a Compact SPICE Model for Carbon-Nanotube Field-Effect Transistors Including Non-idealities and Its Application-Part I: Model of the Intrinsic Channel Region[J]. IEEE Transactions on Electron Devices, 2007, 54 (12):3186-3194, inter-electrode capacitance of CNFET is only equivalent to 4% MOSFET inter-electrode capacitance. Therefore, the address decoder designed with CNFET is provided with less postponement, which can improve working speed of the address decoder. In the binary logic system, n input address decoders can control read-write of $2^n$ SRAM units in SRAM. However, in the multi-value logic system, n input address decoders can control more SRAM units. For instance, the ternary logic with the minimum base can take the logic value of "0", "1" and "2"; ternary n input address decoders can control read-write of $3^n$ SRAM units in SRAM, which improve decoding efficiency of the address decoder. The ternary address decoder used to control SRAM units of the same quantity can reduce the number of packaged pins.

On this account, it is of high significance to design a ternary 2-9 line address decoder realized by CNFET, featuring in low power consumption and less postponement.

SUMMARY OF THE INVENTION

The technical issue to be solved by the present invention is to provide a ternary 2-9 line address decoder realized by CNFET, featuring in low power consumption and less postponement.

The technical solution to solve aforesaid technical issue according to the present invention is stated as follows: A ternary 2-9 line address decoder realized by CNFET, comprising two ternary 1-3 line address decoders of the same structure, nine three-input NAND gates of the same structure and nine inverters of the same structure; the said ternary 1-3 line address decoder is provided with an input terminal, the $1^{st}$ output terminal, the $2^{nd}$ output terminal and the $3^{rd}$ output terminal; the said three-input NAND gate is provided with the $1^{st}$ input terminal, the $2^{nd}$ input terminal, the $3^{rd}$ input terminal and the output terminal; the said ternary 1-3 line address decoder comprises the $1^{st}$ CNFET transistor, the $2^{nd}$ CNFET transistor, the $3^{rd}$ CNFET transistor, the $4^{th}$ CNFET transistor, the $5^{th}$ CNFET transistor, the $6^{th}$ CNFET transistor, the $7^{th}$ CNFET transistor, the $8^{th}$ CNFET transistor, the $9^{th}$ CNFET transistor, the $10^{th}$ CNFET transistor and the $11^{th}$ CNFET transistor; the $3^{rd}$ CNFET transistor, the $4^{th}$ CNFET transistor, the $7^{th}$ CNFET transistor, the $8^{th}$ CNFET transistor and the $10^{th}$ CNFET transistor are P CNFET transistors; the $1^{st}$ CNFET transistor, the $2^{nd}$ CNFET transistor, the $5^{th}$ CNFET transistor, the $6^{th}$ CNFET transistor, the $9^{th}$ CNFET transistor and the $11^{th}$ CNFET transistor are N CNFET transistors; grid of the $1^{st}$ CNFET transistor, source of the $4^{th}$ CNFET transistor, source of the $7^{th}$ CNFET transistor, source of the $8^{th}$ CNFET transistor and source of the $10^{th}$ CNFET transistor are connected to the $1^{st}$ power source; drain of the $1^{st}$ CNFET transistor is connected to the $2^{nd}$ power source, the $2^{nd}$ power source is equivalent to half of the $1^{st}$ power source; grid of the $8^{th}$ CNFET transistor, grid of the $9^{th}$ CNFET transistor and grid of the $10^{th}$ CNFET transistor are connected to grid of the $11^{th}$ CNFET transistor, and the connecting terminal is the input terminal of the said ternary 1-3 line address decoder; grid of the $2^{nd}$ CNFET transistor, grid of the $3^{rd}$ CNFET transistor and drain of the $8^{th}$ CNFET transistor are connected to drain of the $9^{th}$ CNFET transistor, and the connecting terminal is the $1^{st}$ output terminal of the said ternary 1-3 line address decoder; source of the $2^{nd}$ CNFET transistor, source of the $5^{th}$ CNFET transistor, source of the $6^{th}$ CNFET transistor, source of the $9^{th}$ CNFET transistor and source of the $11^{th}$ CNFET transistor are grounded; grid of the $6^{th}$ CNFET transistor, grid of the $7^{th}$ CNFET transistor and drain of the $10^{th}$ CNFET transistor are connected to drain of the $11^{th}$ CNFET transistor; grid of the $4^{th}$ CNFET transistor, grid of the $5^{th}$ CNFET transistor and drain of the $6^{th}$ CNFET transistor are connected to drain of the $7^{th}$ CNFET transistor, and connecting terminal is the $3^{rd}$ output terminal of the said ternary 1-3 line address decoder; source of the $1^{st}$ CNFET transistor, drain of the $2^{nd}$ CNFET transistor and drain of the $3^{rd}$ CNFET transistor are connected to drain of the $5^{th}$ CNFET transistor, and the connecting terminal is the $2^{nd}$ output terminal of the said ternary 1-3 line address decoder; source of the $3^{rd}$ CNFET transistor is connected to drain of the $4^{th}$ CNFET transistor; the two ternary 1-3 line decoders include the $1^{st}$ ternary 1-3 address decoder and the $2^{nd}$ ternary 1-3 line address decoder; the said nine three-input NAND gates include the $1^{st}$ three-input NAND gate; the $2^{nd}$ three-input NAND gate, the 3$^{rd}$ three-input NAND gate, the 4$^{th}$ three-input NAND gate, the 5$^{th}$ three-input NAND gate, the 6$^{th}$ three-input NAND gate, the 7$^{th}$ three-input NAND gate, the 8$^{th}$ three-input NAND gate and the 9$^{th}$ three-input NAND gate; the said nine inverters include the 1$^{st}$ inverter, the 2$^{nd}$ inverter, the 3$^{rd}$ inverter, the 4th inverter, the 5$^{th}$ inverter, the 6$^{th}$ inverter, the 7$^{th}$ inverter, the 8$^{th}$ inverter and the 9$^{th}$ inverter; input terminal of the 1$^{st}$ ternary 1-3 line address decoder is the 1$^{st}$ input terminal of the said ternary 2-9 line address decoder; input terminal of the 2$^{nd}$ ternary 1-3 line address decoder is the 2$^{nd}$ input terminal of the said ternary 2-9 line address decoder; the 1$^{st}$ output terminal of the 1$^{st}$ ternary 1-3 line address decoder is connected to the 2$^{nd}$ input terminal of the 1$^{st}$ three-input NAND gate, the 2$^{nd}$ input terminal of the 2$^{nd}$ three-input NAND gate and the 2$^{nd}$ input terminal of the 3$^{rd}$ three-input NAND gate respectively; the 2$^{nd}$ output terminal of the 1$^{st}$ ternary 1-3 line address decoder is connected to the 2$^{nd}$ input terminal of the 4$^{th}$ three-input NAND gate, the 2$^{nd}$ input terminal of the 5$^{th}$ three-input NAND gate and the 2$^{nd}$ input terminal of the 6$^{th}$ three-input NAND gate; the 3$^{rd}$ output terminal of the 1$^{st}$ ternary 1-3 line address decoder is connected to the 2$^{nd}$ input terminal of the 7$^{th}$ three-input NAND gate, the 2$^{nd}$ input terminal of the 8$^{th}$ three-input NAND gate and the 2$^{nd}$ input terminal of the 9$^{th}$ three-input NAND gate; the 1$^{st}$ output terminal of the 2$^{nd}$ ternary 1-3 line address decoder is connected to the 3$^{rd}$ input terminal of the 1$^{st}$ three-input NAND gate, the 3$^{rd}$ input terminal of the 4$^{th}$ three-input NAND gate and the 3$^{rd}$ input terminal of the 7$^{th}$ three-input NAND gate; the 2$^{nd}$ output terminal of the 2$^{nd}$ ternary 1-3 line address decoder is connected to the 3$^{rd}$ input terminal of the 2$^{nd}$ three-input NAND gate, the 3$^{rd}$ input terminal of the 5$^{th}$ three-input NAND gate and the 3$^{rd}$ input terminal of the 8th three-input NAND gate; the 3$^{rd}$ output terminal of the 2$^{nd}$ ternary 1-3 line address decoder is connected to the 3$^{rd}$ input terminal of the 3$^{rd}$ three-input NAND gate, the 3$^{rd}$ input terminal of the 6$^{th}$ three-input NAND gate and the 3$^{rd}$ input terminal of the 9$^{th}$ three-input NAND gate; the 1$^{st}$ input terminal of the 1$^{st}$ three-input NAND gate, the 1$^{st}$ input terminal of the 2$^{nd}$ three-input NAND gate, the 1$^{st}$ input terminal of the 3$^{rd}$ three-input NAND gate, the 1$^{st}$ input terminal of the 4$^{th}$ three-input NAND gate, the 1$^{st}$ input terminal of the 5$^{th}$ three-input NAND gate, the 1$^{st}$ input terminal of the 6$^{th}$ three-input NAND gate, the 1$^{st}$ input terminal of the 7$^{th}$ three-input NAND gate and the 1$^{st}$ input terminal of the 8$^{th}$ three-input NAND gate are connected to the 1$^{st}$ input terminal of the 9$^{th}$ three-input NAND gate, and the connecting terminal is the enabling terminal of the said ternary 2-9 line address decoder; output terminal of the 1$^{st}$ three-input NAND gate is connected to input terminal of the 1$^{st}$ inverter; output terminal of the 2$^{nd}$ three-input NAND gate is connected to input terminal of the 2$^{nd}$ inverter; output terminal of the 3$^{rd}$ three-input NAND gate is connected to input terminal of the 3$^{rd}$ inverter; output terminal of the 4$^{th}$ three-input NAND gate is connected to input terminal of the 4$^{th}$ inverter; output terminal of the 5$^{th}$ three-input NAND gate is connected to input terminal of the 5$^{th}$ inverter; output terminal of the 6$^{th}$ three-input NAND gate is connected to input terminal of the 6$^{th}$ inverter; output terminal of the 7$^{th}$ three-input NAND gate is connected to input terminal of the 7$^{th}$ inverter; output terminal of the 8$^{th}$ three-input NAND gate is connected to input terminal of the 8$^{th}$ inverter; output terminal of the 9$^{th}$ three-input NAND gate is connected to input terminal of the 9$^{th}$ inverter; output terminal of the 1$^{st}$ inverter is the 1$^{st}$ output terminal of the said ternary 2-9 line address decoder; output terminal of the 2$^{nd}$ inverter is the 2$^{nd}$ output terminal of the said ternary 2-9 line address decoder; output terminal of the 3$^{rd}$ inverter is the 3$^{rd}$ output terminal of the said ternary 2-9 line address decoder; output terminal of the 4$^{th}$ inverter is the 4$^{th}$ output terminal of the said ternary 2-9 line address decoder; output terminal of the 5$^{th}$ inverter is the 5$^{th}$ output terminal of the said ternary 2-9 line address decoder; output terminal of the 6$^{th}$ inverter is the 6$^{th}$ output terminal of the said ternary 2-9 line address decoder; output terminal of the 7$^{th}$ inverter is the 7$^{th}$ output terminal of the said ternary 2-9 line address decoder; output terminal of the 8$^{th}$ inverter is the 8$^{th}$ output terminal of the said ternary 2-9 line address decoder; output terminal of the 9$^{th}$ inverter is the 9$^{th}$ output terminal of the said ternary 2-9 line address decoder;

Threshold voltage of the 1$^{st}$ CNFET transistor is 0.428 v; threshold voltage of the 2$^{nd}$ CNFET transistor and the 5$^{th}$ CNFET transistor is 0.557 v; threshold voltage of the 3$^{rd}$ CNFET transistor and the 4$^{th}$ CNFET transistor is −0.557 v, threshold voltage of the 6$^{th}$ CNFET transistor and the 9$^{th}$ CNFET transistor is 0.289 v; threshold voltage of the 7$^{th}$ CNFET transistor and the 8$^{th}$ CNFET transistor is −0.557 v; threshold voltage of the 10$^{th}$ CNFET transistor is −0.289 v; threshold voltage of the 11$^{th}$ CNFET transistor is 0.557 v.

Caliber of the 1$^{st}$ CNFET transistor is 1.018 nm; caliber of the 2$^{nd}$ CNFET transistor, the 3$^{rd}$ CNFET transistor, the 4$^{th}$ CNFET transistor, the 5$^{th}$ CNFET transistor, the 7$^{th}$ CNFET transistor, the 8$^{th}$ CNFET transistor and the 11$^{th}$ CNFET transistor is 0.783 nm; caliber of the 6$^{th}$ CNFET transistor and the 9$^{th}$ CNFET transistor is 1.487 nm; caliber of the 10$^{th}$ CNFET transistor is 1.488 nm. Such circuit can make use of less supply voltage for driving to further reduce the power consumption and postponement.

The 1$^{st}$ power source is 0.9 v; the 2$^{nd}$ power source is 0.45 v. The circuit makes use of the 1$^{st}$ power source and the 2$^{nd}$ power source to obtain the ternary output response signal to improve the stability of the circuit.

The said three-input NAND gate comprises the 12$^{th}$ CNFET transistor, the 13$^{th}$ CNFET transistor, the 14$^{th}$ CNFET transistor, the 15$^{th}$ CNFET transistor, the 16$^{th}$ CNFET transistor, the 17$^{th}$ CNFET transistor and the 18$^{th}$ CNFET transistor; the 12$^{th}$ CNFET transistor, the 16$^{th}$ CNFET transistor and the 17$^{th}$ CNFET transistor are P CNFET transistors; the 13$^{th}$ CNFET transistor, the 14$^{th}$ CNFET transistor, the 15$^{th}$ CNFET transistor and the 18$^{th}$ CNFET transistor are N CNFET transistors; source of the 12$^{th}$ CNFET transistor, source of the 16$^{th}$ CNFET transistor, source of the 17$^{th}$ CNFET transistor and grid of the 18$^{th}$ CNFET transistor are connected to the 1$^{st}$ power source; drain of the 18$^{th}$ CNFET transistor is connected to the 2$^{nd}$ power source; grid of the 12$^{th}$ CNFET transistor is connected to grid of the 13$^{th}$ CNFET transistor, and the connecting terminal is the 1$^{st}$ input terminal of the said three-input NAND gate; drain of the 12$^{th}$ CNFET transistor, drain of the 13$^{th}$ CNFET transistor, drain of the 16$^{th}$ CNFET transistor and drain of the 17$^{th}$ CNFET transistor are connected to source of the 18$^{th}$ CNFET transistor, and the connecting terminal is the output terminal of the said three-input NAND gate; source of the 13$^{th}$ CNFET transistor is connected to drain of 14$^{th}$ CNFET transistor; source of the 14$^{th}$ CNFET transistor is connected to drain of the 15$^{th}$ CNFET transistor; grid of the 14$^{th}$ CNFET transistor is connected to grid of the 16$^{th}$ CNFET transistor, and the connecting terminal is the 2$^{nd}$ input terminal of the said three-input NAND gate; source of the 15$^{th}$ CNFET transistor is grounded; grid of the 15$^{th}$ CNFET transistor is connected to grid of the 17$^{th}$ CNFET transistor, and the connecting terminal is the 3$^{rd}$ input terminal of the said three-input NAND gate. Such circuit can make use of less supply voltage for driving to further reduce the power consumption and postponement.

Caliber of the 12$^{th}$ CNFET transistor, the 13$^{th}$ CNFET transistor, the 14$^{th}$ CNFET transistor, the 15$^{th}$ CNFET transistor, the 16$^{th}$ CNFET transistor and the 17$^{th}$ CNFET transistor is 0.783 nm; caliber of the 18$^{th}$ CNFET transistor is 1.018 nm. Such circuit can make use of less supply voltage for driving to further reduce the power consumption and postponement.

The said inverter comprises the 19$^{th}$ CNFET transistor, the 20$^{th}$ CNFET transistor and 21$^{st}$ CNFET transistor; the 19$^{th}$ CNFET transistor belongs to P CNFET transistor; the 19$^{th}$ CNFET transistor and the 20$^{th}$ CNFET transistor belongs to N CNFET transistors; source of the 19$^{th}$ CNFET transistor and grid of the 21$^{st}$ CNFET transistor are connected to the 1$^{st}$ power source; drain of the 21$^{st}$ CNFET transistor is connected to the 2$^{nd}$ power source; grid of the 19$^{th}$ CNFET transistor is connected to grid of the 20$^{th}$ CNFET transistor, and the connecting terminal is the input terminal of the said inverter; drain of the 19$^{th}$ CNFET transistor and drain of the 20$^{th}$ CNFET transistor are connected to source of the 21$^{st}$ CNFET transistor, and the connecting terminal is the output terminal of the said inverter; source of the 20$^{th}$ CNFET transistor is grounded. Such circuit makes use of multi threshold voltages of CNFET transistors to ensure easy regulation of grid voltage and improvement of stability.

Caliber of the 19$^{th}$ CNFET transistor and the 20$^{th}$ CNFET transistor is 0.783 nm; caliber of the 21$^{st}$ CNFET transistor is 1.018 nm. Such circuit makes use of multi threshold voltages of CNFET transistors to ensure easy regulation of grid voltage and improvement of stability.

Compared with prior arts, advantage of the present invention lies in the use of two ternary 1-3 line address decoders of the same structure, nine three-input NAND gate of the same structure and nine inverters of the same structure to realize ternary 2-9 line address decoders; the ternary 1-3 line address decoder comprises the 1$^{st}$ CNFET transistor, the 2$^{nd}$ CNFET transistor, the 3$^{rd}$ CNFET transistor, the 4$^{th}$ CNFET transistor, the 5$^{th}$ CNFET transistor, the 6$^{th}$ CNFET transistor, the 7$^{th}$ CNFET transistor, the 8th CNFET transistor, the 9$^{th}$ CNFET transistor, the 10$^{th}$ CNFET transistor and the 11$^{th}$ CNFET transistor; compared with the 3-8 line address decoder, it features in limited deviation to output terminals and significant reduction in the number of input terminals, which can minimize the number of ports as packaging, and improve decoding efficiency; furthermore, it is realized by CNFET, which features in low power consumption and less postponement.

BRIEF DESCRIPTION OF DRAWINGS

FIG. 3 (b) is the graphic diagram for the three-input NAND gate of the ternary 2-9 line address decoder of the present invention as realized by CNFET;

FIG. 4 (b) is the graphical diagram for the inverter of the ternary 2-9 line address decoder of the present invention as realized by CNFET;

DESCRIPTION OF EMBODIMENTS

The present invention is further described as follows in combination with embodiments for drawings.

Embodiment

Figure 1:
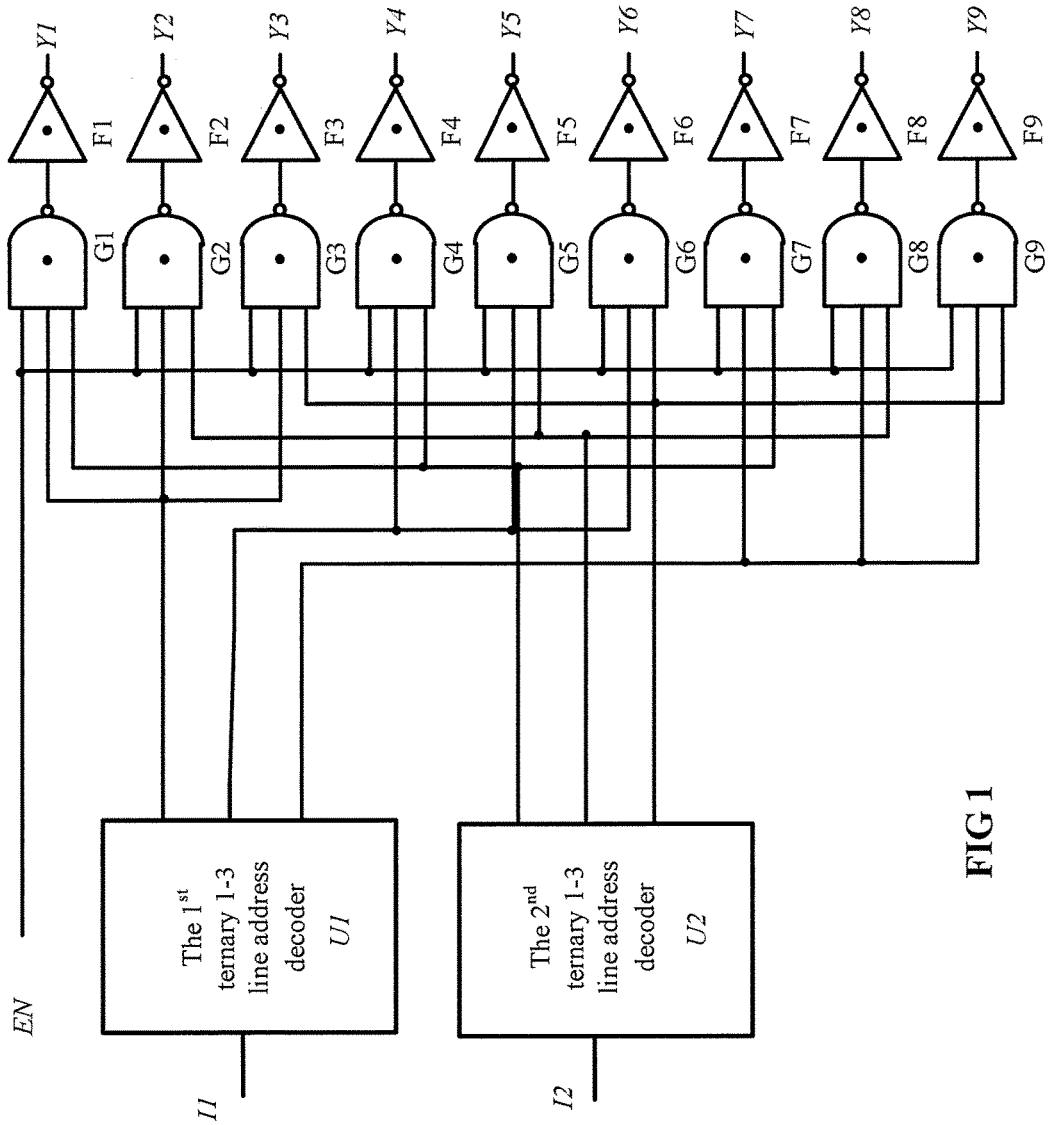
FIG. 1 is the structural diagram for the ternary 2-9 line address decoder of the present invention as realized by CNFET.
Figure 2:
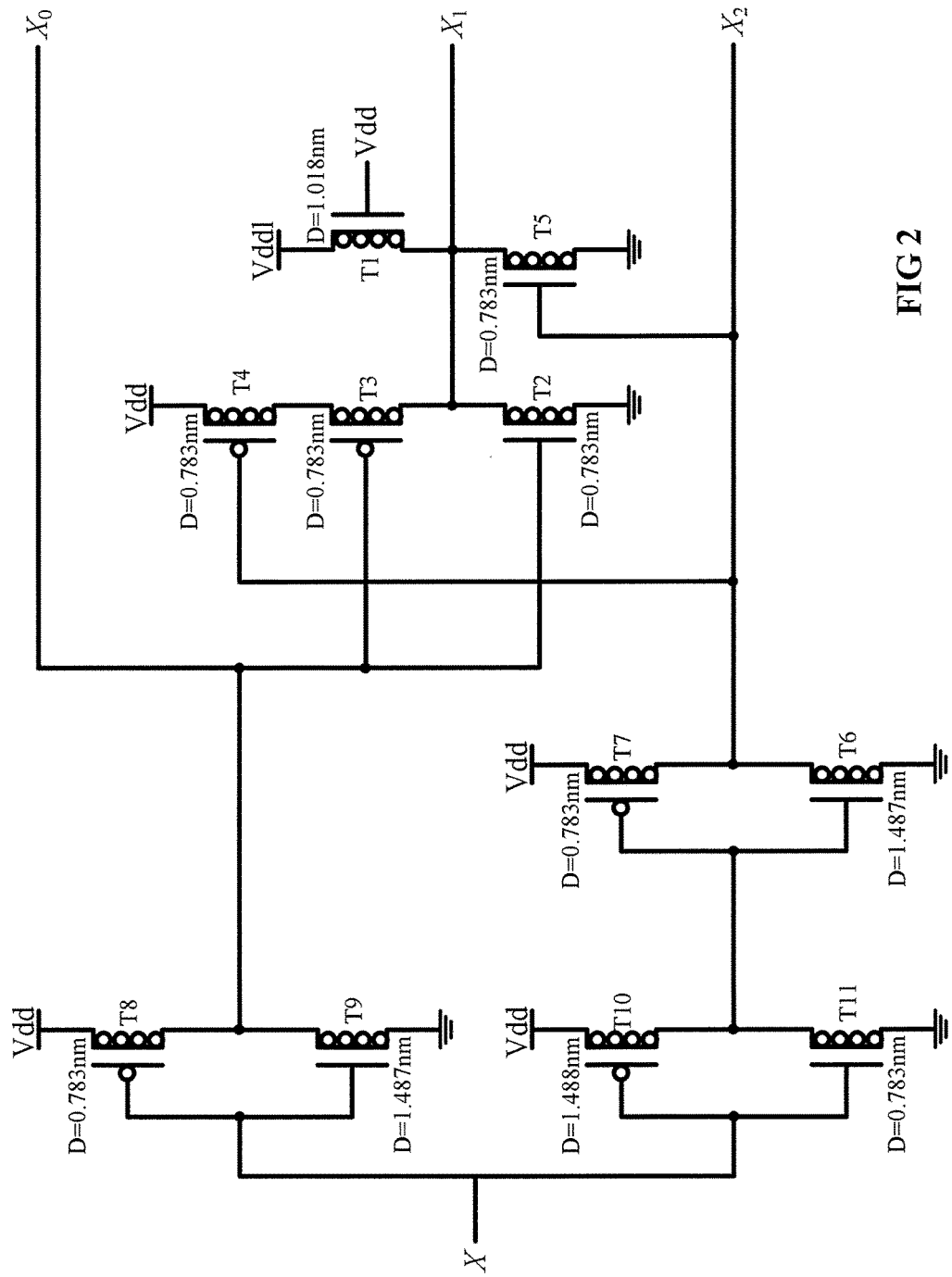
FIG. 2 is the circuit diagram for the ternary 1-3 line address decoder in the ternary 2-9 line address decoder of the present invention as realized by CNFET.

A ternary 2-9 line address decoder realized by CNFET as shown in FIGS. 1 and 2, comprising two ternary 1-3 line address decoders of the same structure, nine three-input NAND gate of the same structure and nine inverters of the same structure; the said ternary 1-3 line address decoder is provided with an input terminal, the 1$^{st}$ output terminal, the 2$^{nd}$ output terminal and the 3$^{rd}$ output terminal; the said three-input NAND gate is provided with the 1$^{st}$ input terminal, the 2$^{nd}$ input terminal, the 3$^{rd}$ input terminal and the output terminal; the said ternary 1-3 line address decoder comprises the 1$^{st}$ CNFET transistor T1, the 2$^{nd}$ CNFET transistor T2, the 3$^{rd}$ CNFET transistor T3, the 4$^{th}$ CNFET transistor T4, the 5$^{th}$ CNFET transistor T5, the 6$^{th}$ CNFET transistor T6, the 7$^{th}$ CNFET transistor T7, the 8$^{th}$ CNFET transistor T8, the 9$^{th}$ CNFET transistor T9, the 10$^{th}$ CNFET transistor T10 and the 11$^{th}$ CNFET transistor T11; the 3$^{rd}$ CNFET transistor T3, the 4$^{th}$ CNFET transistor T4, the 7$^{th}$ CNFET transistor T7, the 8$^{th}$ CNFET transistor T8 and the 10$^{th}$ CNFET transistor T10 are P CNFET transistors; the 1$^{st}$ CNFET transistor T1, the 2$^{nd}$ CNFET transistor T2, the 5$^{th}$ CNFET transistor T5, the 6$^{th}$ CNFET transistor T6, the 9$^{th}$ CNFET transistor T9 and the 11$^{th}$ CNFET transistor T11 are N CNFET transistors; grid of the 1$^{st}$ CNFET transistor T1, source of the 4$^{th}$ CNFET transistor T4, source of the 7$^{th}$ CNFET transistor T7, source of the 8$^{th}$ CNFET transistor T8 and source of the 10$^{th}$ CNFET transistor T10 are connected to the 1$^{st}$ power source Vdd; drain of the 1$^{st}$ CNFET transistor T1 is connected to the 2$^{nd}$ power source Vdd1, the 2$^{nd}$ power source Vdd1 is equivalent to half of the 1$^{st}$ power source Vdd; grid of the 8$^{th}$ CNFET transistor T8, grid of the 9$^{th}$ CNFET transistor T9 and grid of the 10$^{th}$ CNFET transistor T10 are connected to grid of the 11$^{th}$ CNFET transistor T11, and the connecting terminal is the input terminal of the said ternary 1-3 line address decoder; grid of the 2$^{nd}$ CNFET transistor T2, grid of the 3$^{rd}$ CNFET transistor T3 and drain of the 8$^{th}$ CNFET transistor T8 are connected to drain of the 9$^{th}$ CNFET transistor T9, and the connecting terminal is the 1$^{st}$ output terminal of the said ternary 1-3 line address decoder; source of the 2$^{nd}$ CNFET transistor T2, source of the 5$^{th}$ CNFET transistor T5, source of the 6$^{th}$ CNFET transistor T6, source of the 9$^{th}$ CNFET transistor T9 and source of the 11$^{th}$ CNFET transistor T11 are grounded; grid of the 6$^{th}$ CNFET transistor T6, grid of the 7$^{th}$ CNFET transistor T7 and drain of the 10$^{th}$ CNFET transistor T10 are connected to drain of the 11$^{11}$ CNFET transistor T11; grid of the 4$^{th}$ CNFET transistor T4, grid of the 5$^{th}$ CNFET transistor T5 and drain of the 6$^{th}$ CNFET transistor T6 are connected to drain of the 7$^{th}$ CNFET transistor T7, and connecting terminal is the 3$^{rd}$ output terminal of the said ternary 1-3 line address decoder; source of the 1$^{st}$ CNFET transistor T1, drain of the 2$^{nd}$ CNFET transistor T2 and drain of the 3$^{rd}$ CNFET transistor T3 are connected to drain of the 5$^{th}$ CNFET transistor T5, and the connecting terminal is the $2^{nd}$ output terminal of the said ternary 1-3 line address decoder; source of the 3rd CNFET transistor T3 is connected to drain of the $4^{th}$ CNFET transistor; the two ternary 1-3 line decoders are the $1^{st}$ ternary 1-3 address decoder and the $2^{nd}$ ternary 1-3 line address decoder U2; the said nine three-input NAND gates include the $1^{st}$ three-input NAND gate G1; the $2^{nd}$ three-input NAND gate G2, the $3^{rd}$ three-input NAND gate G3, the $4^{th}$ three-input NAND gate G4, the $5^{th}$ three-input NAND gate G5, the $6^{th}$ three-input NAND gate G6, the $7^{th}$ three-input NAND gate G7, the $8^{th}$ three-input NAND gate G8 and the $9^{th}$ three-input NAND gate G9; the said nine inverters include the $1^{st}$ inverter F1, the $2^{nd}$ inverter F2, the $3^{rd}$ inverter F3, the $4^{th}$ inverter F4, the $5^{th}$ inverter F5, the $6^{th}$ inverter F6, the $7^{th}$ inverter F7, the $8^{th}$ inverter F8 and the $9^{th}$ inverter F9; input terminal of the $1^{st}$ ternary 1-3 line address decoder U1 is the $1^{st}$ input terminal of the said ternary 2-9 line address decoder; input terminal of the $2^{nd}$ ternary 1-3 line address decoder U2 is the $2^{nd}$ input terminal of the said ternary 2-9 line address decoder; the $1^{st}$ output terminal of the $1^{st}$ ternary 1-3 line address decoder is connected to the $2^{nd}$ input terminal of the $1^{st}$ three-input NAND gate G1, the $2^{nd}$ input terminal of the $2^{nd}$ three-input NAND gate G2 and the $2^{nd}$ input terminal of the $3^{rd}$ three-input NAND gate G3 respectively; the $2^{nd}$ output terminal of the $1^{st}$ ternary 1-3 line address decoder U1 is connected to the $2^{nd}$ input terminal of the $4^{th}$ three-input NAND gate G4, the $2^{nd}$ input terminal of the $5^{th}$ three-input NAND gate G5 and the $2^{nd}$ input terminal of the $6^{th}$ three-input NAND gate G6; the $3^{rd}$ output terminal of the $1^{st}$ ternary 1-3 line address decoder U1 is connected to the $2^{nd}$ input terminal of the $7^{th}$ three-input NAND gate G7, the $2^{nd}$ input terminal of the $8^{th}$ three-input NAND gate G8 and the $2^{nd}$ input terminal of the $9^{th}$ three-input NAND gate G9; the $1^{st}$ output terminal of the $2^{nd}$ ternary 1-3 line address decoder U2 is connected to the $3^{rd}$ input terminal of the $1^{st}$ three-input NAND gate G1, the $3^{rd}$ input terminal of the $4^{th}$ three-input NAND gate G4 and the $3^{rd}$ input terminal of the $7^{th}$ three-input NAND gate G7; the $2^{nd}$ output terminal of the $2^{nd}$ ternary 1-3 line address decoder U2 is connected to the $3^{rd}$ input terminal of the $2^{nd}$ three-input NAND gate G2, the $3^{rd}$ input terminal of the $5^{th}$ three-input NAND gate G5 and the $3^{rd}$ input terminal of the $8^{th}$ three-input NAND gate G8; the $3^{rd}$ output terminal of the $2^{nd}$ ternary 1-3 line address decoder U2 is connected to the $3^{rd}$ input terminal of the $3^{rd}$ three-input NAND gate G3, the $3^{rd}$ input terminal of the $6^{th}$ three-input NAND gate G6 and the $3^{rd}$ input terminal of the $9^{th}$ three-input NAND gate G9; the $1^{st}$ input terminal of the $1^{st}$ three-input NAND gate G1, the $1^{st}$ input terminal of the $2^{nd}$ three-input NAND gate G2, the $1^{st}$ input terminal of the $3^{rd}$ three-input NAND gate G3, the $1^{st}$ input terminal of the $4^{th}$ three-input NAND gate G4, the $1^{st}$ input terminal of the $5^{th}$ three-input NAND gate G5, the $1^{st}$ input terminal of the $6^{th}$ three-input NAND gate G6, the $1^{st}$ input terminal of the $7^{th}$ three-input NAND gate G7 and the $1^{st}$ input terminal of the $8^{th}$ three-input NAND gate G8 are connected to the $1^{st}$ input terminal of the $9^{th}$ three-input NAND gate G9, and the connecting terminal is the enabling terminal of the said ternary 2-9 line address decoder; output terminal of the $1^{st}$ three-input NAND gate G1 is connected to input terminal of the $1^{st}$ inverter F1; output terminal of the $2^{nd}$ three-input NAND gate G2 is connected to input terminal of the $2^{nd}$ inverter F2; output terminal of the $3^{rd}$ three-input NAND gate G3 is connected to input terminal of the $3^{rd}$ inverter F3; output terminal of the $4^{th}$ three-input NAND gate G4 is connected to input terminal of the $4^{th}$ inverter F4; output terminal of the $5^{th}$ three-input NAND gate G5 is connected to the $5^{th}$ inverter F5; output terminal of the $6^{th}$ three-input NAND gate G6 is connected to the $6^{th}$ inverter F6; output terminal of the $7^{th}$ three-input NAND gate G7 is connected to input terminal of the $7^{th}$ inverter F7; output terminal of the $8^{th}$ three-input NAND gate G8 is connected to input terminal of the $8^{th}$ inverter F8; output terminal of the $9^{th}$ three-input NAND gate G9 is connected to input terminal of the $9^{th}$ inverter F9; output terminal of the $1^{st}$ inverter F1 is the $1^{st}$ output terminal of the said ternary 2-9 line address decoder; output terminal of the $2^{nd}$ inverter F2 is the $2^{nd}$ output terminal of the said ternary 2-9 line address decoder; output terminal of the $3^{rd}$ inverter F3 is the $3^{rd}$ output terminal of the said ternary 2-9 line address decoder; output terminal of the $4^{th}$ inverter F4 is the $4^{th}$ output terminal of the said ternary 2-9 line address decoder; output terminal of the $5^{th}$ inverter F5 is the $5^{th}$ output terminal of the said ternary 2-9 line address decoder; output terminal of the $6^{th}$ inverter F6 is the $6^{th}$ output terminal of the said ternary 2-9 line address decoder; output terminal of the $7^{th}$ inverter F7 is the $7^{th}$ output terminal of the said ternary 2-9 line address decoder; output terminal of the $8^{th}$ inverter F8 is the $8^{th}$ output terminal of the said ternary 2-9 line address decoder; output terminal of the $9^{th}$ inverter F9 is the $9^{th}$ output terminal of the said ternary 2-9 line address decoder.

In this embodiment, threshold voltage of the $1^{st}$ CNFET transistor T1 is 0.428 v; threshold voltage of the $2^{nd}$ CNFET transistor T2 and the $5^{th}$ CNFET transistor T5 is 0.557 v; threshold voltage of the $3^{rd}$ CNFET transistor T3 and the $4^{th}$ CNFET transistor T4 is −0.557 v; threshold voltage of the $6^{th}$ CNFET transistor T6 and the $9^{th}$ CNFET transistor T9 is 0.289 v; threshold voltage of the $7^{th}$ CNFET transistor T7 and the $8^{th}$ CNFET transistor T8 is −0.557 v; threshold voltage of the $10^{th}$ CNFET transistor T10 is −0.289 v; threshold voltage of the $11^{th}$ CNFET transistor T11 is 0.557 v.

In this embodiment, caliber of the $1^{st}$ CNFET transistor T1 is 1.018 nm, caliber of the $2^{nd}$ CNFET transistor T2, the $3^{rd}$ CNFET transistor T3, the $4^{th}$ CNFET transistor T4, the $5^{th}$ CNFET transistor T5, the $7^{th}$ CNFET transistor T7, the $8^{th}$ CNFET transistor T8 and the $11^{th}$ CNFET transistor T11 is 0.783 nm; caliber of the $6^{th}$ CNFET transistor T6 and the $9^{th}$ CNFET transistor T9 is 1.487 nm; caliber of the $10^{th}$ CNFET transistor T10 is 1.488 nm.

In this embodiment, the $1^{st}$ power source Vdd is 0.9 v, and the $2^{nd}$ power source Vdd1 is 0.45 v.

Figure 3A:
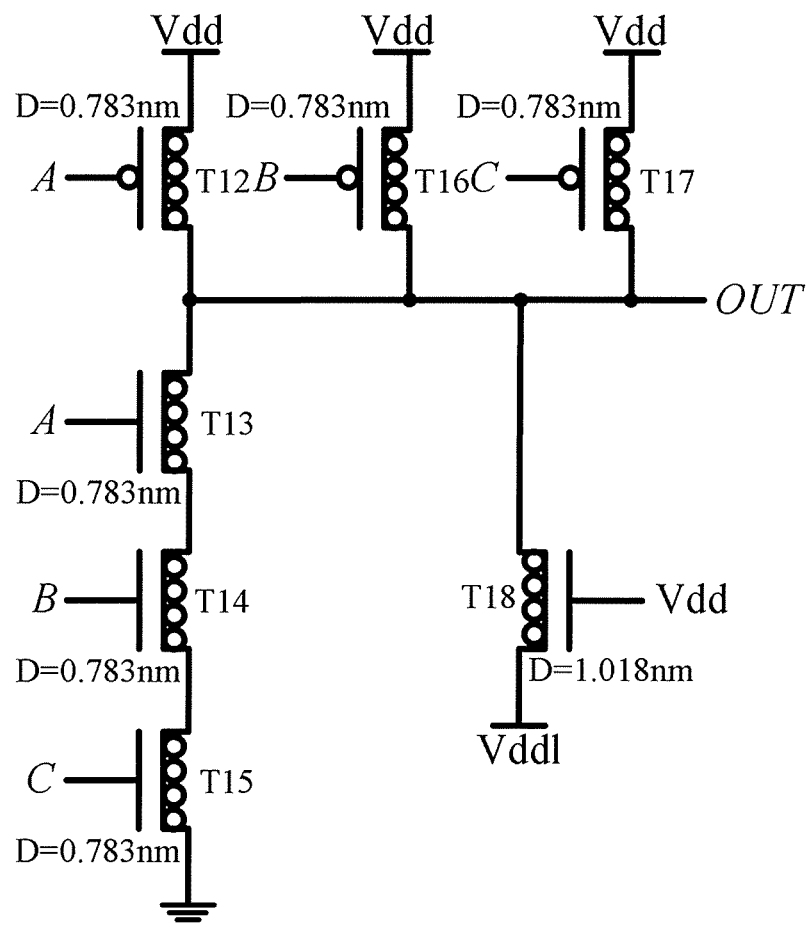
FIG. 3 (a) is the circuit diagram for the three-input NAND gate of the ternary 2-9 line address decoder of the present invention as realized by CNFET.
Figure 3B:
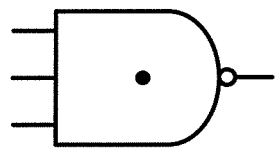

As shown in FIGS. 3(a) and 3(b), the three-input NAND gate in this embodiment comprises the $12^{th}$ CNFET transistor T12, the $13^{th}$ CNFET transistor T13, the $14^{th}$ CNFET transistor T14, the $15^{th}$ CNFET transistor T15, the $16^{th}$ CNFET transistor T16, the $17^{th}$ CNFET transistor T17 and the $18^{th}$ CNFET transistor T18; the $12^{th}$ CNFET transistor T12, the $16^{th}$ CNFET transistor T16 and the $17^{th}$ CNFET transistor T17 are P CNFET transistors; the $13^{th}$ CNFET transistor T13, the $14^{th}$ CNFET transistor T14, the $15^{th}$ CNFET transistor T15 and the $18^{th}$ CNFET transistor T18 are N CNFET transistors; source of the $12^{th}$ CNFET transistor T12, source of the $16^{th}$ CNFET transistor T16, source of the $17^{th}$ CNFET transistor T17 and grid of the $18^{th}$ CNFET transistor T18 are connected to the $1^{st}$ power source Vdd; drain of the $18^{th}$ CNFET transistor T18 is connected to the $2^{nd}$ power source Vdd1; grid of the $12^{th}$ CNFET transistor T12 is connected to grid of the $13^{th}$ CNFET transistor T13, and the connecting terminal is the $1^{st}$ input terminal of the said three-input NAND gate; drain of the $12^{th}$ CNFET transistor T12, drain of the $13^{th}$ CNFET transistor T13, drain of the $16^{th}$ CNFET transistor T16 and drain of the $17^{th}$ CNFET transistor T17 are connected to source of the $18^{th}$ CNFET transistor T18, and the connecting terminal is the output terminal of the said three-input NAND gate; source of the 13$^{th}$ CNFET transistor T13 is connected to drain of 14$^{th}$ CNFET transistor T14; source of the 14$^{th}$ CNFET transistor T14 is connected to drain of the 15$^{th}$ CNFET transistor T15; grid of the 14$^{th}$ CNFET transistor T14 is connected to grid of the 16$^{th}$ CNFET transistor T16, and the connecting terminal is the 2$^{nd}$ input terminal of the said three-input NAND gate; source of the 15$^{th}$ CNFET transistor T15 is grounded; grid of the 15$^{th}$ CNFET transistor T15 is connected to grid of the 17$^{th}$ CNFET transistor T17, and the connecting terminal is the 3$^{rd}$ input terminal of the said three-input NAND gate.

In this embodiment, Caliber of the 12$^{th}$ CNFET transistor T12, the 13$^{th}$ CNFET transistor T13, the 14$^{th}$ CNFET transistor T14, the 15$^{th}$ CNFET transistor T15, the 16$^{th}$ CNFET transistor T16 and the 17$^{th}$ CNFET transistor T17 is 0.783 nm; caliber of the 18$^{th}$ CNFET transistor T18 is 1.018 nm.

Figure 4A:
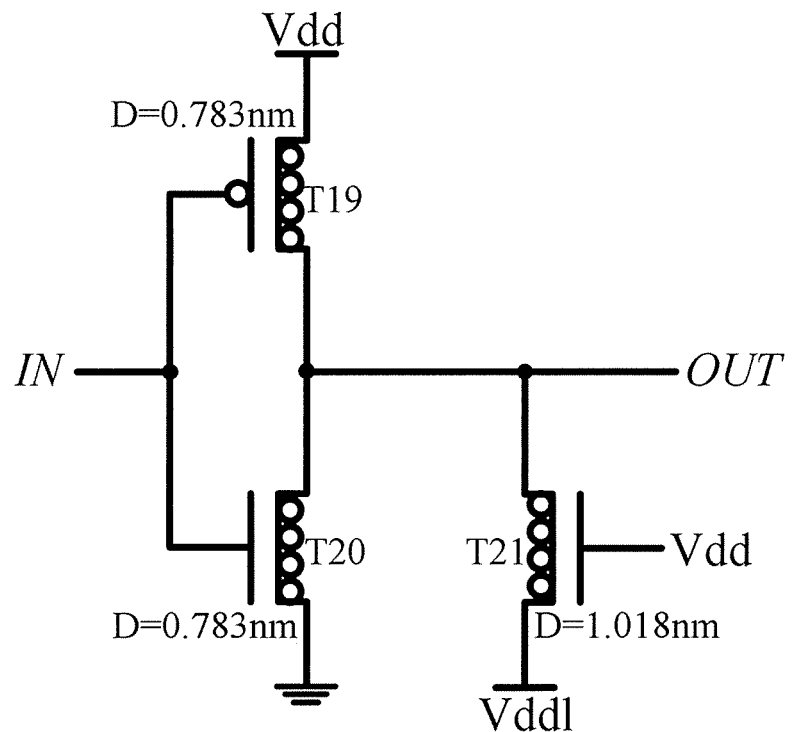
FIG. 4 (a) is the circuit diagram for the inverter of the ternary 2-9 line address decoder of the present invention as realized by CNFET.
Figure 4B:
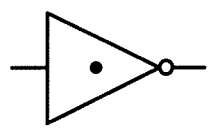

As shown in FIGS. 4(a) and 4(b), The said inverter in this embodiment comprises the 19$^{th}$ CNFET transistor T19, the 20$^{th}$ CNFET transistor T20 and 21$^{st}$ CNFET transistor T21; the 19$^{th}$ CNFET transistor T19 belongs to P CNFET transistor; the 19$^{th}$ CNFET transistor T19 and the 20$^{th}$ CNFET transistor T20 belongs to N CNFET transistors; source of the 19$^{th}$ CNFET transistor T19 and grid of the 21$^{st}$ CNFET transistor T21 are connected to the 1$^{st}$ power source Vdd; drain of the 21$^{st}$ CNFET transistor T21 is connected to the 2$^{nd}$ power source Vdd1; grid of the 19$^{th}$ CNFET transistor T19 is connected to grid of the 20$^{th}$ CNFET transistor T20, and the connecting terminal is the input terminal of the said inverter; drain of the 19$^{th}$ CNFET transistor T19 and drain of the 20$^{th}$ CNFET transistor T20 are connected to source of the 21$^{st}$ CNFET transistor T21, and the connecting terminal is the output terminal of the said inverter; source of the 20$^{th}$ CNFET transistor T20 is grounded.

In this embodiment, caliber of the 19$^{th}$ CNFET transistor and the 20$^{th}$ CNFET transistor is 0.783 nm; caliber of the 21$^{st}$ CNFET transistor is 1.018 nm.

The ternary 2-9 line address decoder of the present invention as realized by CNFET is simulated by using 32 nm standard model base of Stanford University to verify its logic function, and analysis the power consumption and postponement. The standard model base is in consideration of impact from such factors as CNT charge shielding effect, parasitic effect, resistance of source/drain and grid and capacitance on the circuit, which can ensure accurate and reliable simulation results. Major parameters for CNFET during simulation are as shown in Table 16; voltage of power source Vdd and power source Vdd1 is up to 0.9V and 0.45V respectively.

TABLE 1

Major Parameters for CNFET Model

| Symbol | Parameter | Simulation value |
|---|---|---|
| $L_{ch}$ | Length of physical channel | 32 nm |
| $L_{geff}$ | Length of carbon-nanotube ballistic scattering free path | 100 nm |
| $L_{ss}$ | Doping length scattering to the source carbon nanotube | 32 nm |
| $L_{dd}$ | Doping length scattering to the drain carbon nanotube | 32 nm |
| $T_{ox}$ | Thickness of high k media under the grid | 4 nm |
| Pitch | Carbon nanotube space | 20 nm |

Figure 5:
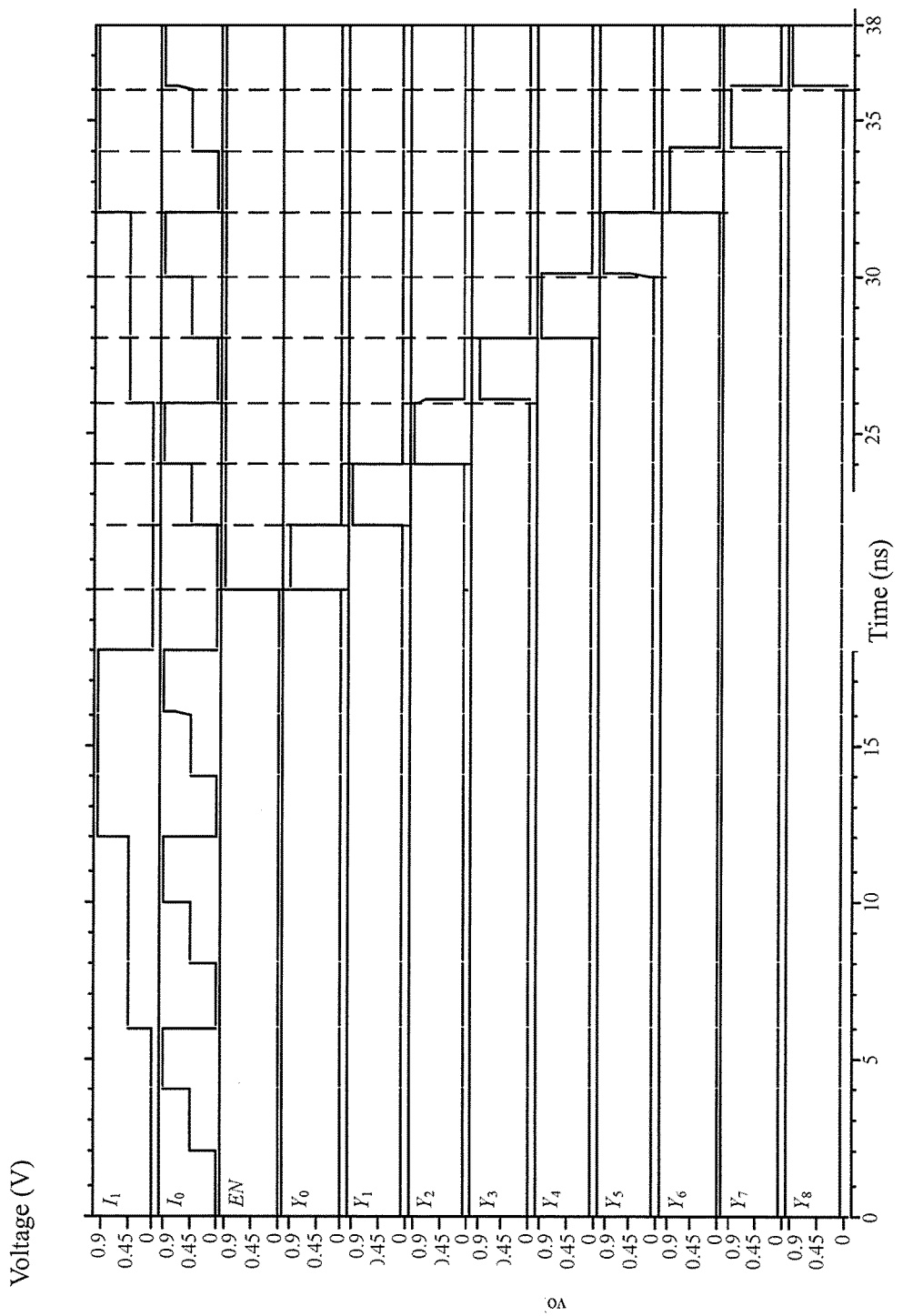
FIG. 5 is the simulation waveform of the ternary 2-9 line address decoder of the present invention as realized by CNFET.

Simulation waveform for the ternary 2-9 line address decoder of the present invention as realized by CNFET is as shown in FIG. 5. According to analysis of FIG. 5, high level of enabling signal EN is valid; when enabling signal EN is at high level, the address decoder is to be at the working status; when enabling signal EN is at low level, output signal is "0", and the address decoder is at non-working status no matter the 1$^{st}$ input signal I$_1$ is input, and the 2$^{nd}$ input signal is at any status; thus, the ternary 2-9 line address decoder of the present invention as realized by CNFET is correct in logic function.

When the number of output terminals of two different address decoders is identical, or decoding efficiency is identical, the two address decoders can control operation of the same number of SRAM units in the SRAM array. There only exists minor deviation to output terminal of the ternary 2-9 line address decoder of the present invention as realized by CNFET and the 3-8 line address decoder, and there is significant reduction in the number of the input terminals; therefore, the ternary 2-9 line address decoder of the present invention as realized by CNFET can reduce the number of ports after packaging, and improve the decoding efficiency.

Postponement of the ternary 2-9 line address decoder of the present invention is compared with that of conventional 3-8 line address decoder, 3-8 line block decoder and 3-8 line binary address decoder recorded in Literature 1: "Novel Design Technique of Address Decoder for SRAM" in case of minor deviation to the number of output terminals of the address decoder; comparison data is as shown in Table 2.

TABLE 2

A Comparison of Postponement between the ternary Address Decoder and the binary Address Decoder

| Address Decoder Type | Conventional Address Decoder | Block Decoder | Literature 1 | The Present Invention |
|---|---|---|---|---|
| | | 3-8 line | | 2-9 line |
| Postponement (ps) | 94 | 59 | 53 | 46 |

According to analysis of Table 2, postponement of the ternary 2-9 line address decoder of the present invention can be reduced by 13.2% as compared with that of the 3-8 line binary address decoder, which is favorable for improvement of SRAM performance.

The invention claimed is:

1. A ternary 2-9 line address decoder realized by Carbon Nanotube Field Effect Transistor (CNFET), comprising: two ternary 1-3 line address decoders of the same structure, nine three-input NAND gates of the same structure and nine inverters of the same structure;

wherein each of the said two ternary 1-3 line address decoders is provided with an input terminal, a 1$^{st}$ output terminal, a 2$^{nd}$ output terminal and a 3$^{rd}$ output terminal;

wherein each of the said three-input NAND gates is provided with a $1^{st}$ input terminal, a $2^{nd}$ input terminal, a $3^{rd}$ input terminal and an output terminal;

wherein each of the said ternary 1-3 line address decoders comprises a $1^{st}$ CNFET transistor, a $2^{nd}$ CNFET transistor, a $3^{rd}$ CNFET transistor, a $4^{th}$ CNFET transistor, a $5^{th}$ CNFET transistor, a $6^{th}$ CNFET transistor, a $7^{th}$ CNFET transistor, an $8^{th}$ CNFET transistor, a $9^{th}$ CNFET transistor, a $10^{11}$ CNFET transistor and an $11^{th}$ CNFET transistor; wherein the $3^{rd}$ CNFET transistor, the $4^{th}$ CNFET transistor, the $7^{th}$ CNFET transistor, the $8^{th}$ CNFET transistor and the $10^{th}$ CNFET transistor are P CNFET transistors; and the $1^{st}$ CNFET transistor, the $2^{nd}$ CNFET transistor, the $5^{th}$ CNFET transistor, the $6^{th}$ CNFET transistor, the $9^{th}$ CNFET transistor and the $11^{th}$ CNFET transistor are N CNFET transistors;

wherein a grid of the $1^{st}$ CNFET transistor, a source of the $4^{th}$ CNFET transistor, a source of the $7^{th}$ CNFET transistor, a source of the $8^{th}$ CNFET transistor and a source of the $10^{th}$ CNFET transistor are connected to a $1^{st}$ power source; a drain of the $1^{st}$ CNFET transistor is connected to a $2^{nd}$ power source, and the $2^{nd}$ power source is equivalent to half of the $1^{st}$ power source;

wherein a grid of the $8^{th}$ CNFET transistor, a grid of the $9^{th}$ CNFET transistor and a grid of the $10^{th}$ CNFET transistor are connected to a grid of the $11^{th}$ CNFET transistor which forms a first connecting terminal, and the first connecting terminal is the input terminal of the said ternary 1-3 line address decoder;

wherein a grid of the $2^{nd}$ CNFET transistor, a grid of the $3^{rd}$ CNFET transistor and a drain of the $8^{th}$ CNFET transistor are connected to a drain of the $9^{th}$ CNFET transistor which forms a second connecting terminal, and the second connecting terminal is the $1^{st}$ output terminal of the said ternary 1-3 line address decoder;

wherein a source of the $2^{nd}$ CNFET transistor, a source of the $5^{th}$ CNFET transistor, a source of the $6^{th}$ CNFET transistor, a source of the $9^{th}$ CNFET transistor and a source of the $11^{th}$ CNFET transistor are grounded;

wherein a grid of the $6^{th}$ CNFET transistor, a grid of the $7^{th}$ CNFET transistor and a drain of the $10^{th}$ CNFET transistor are connected to a drain of the $11^{th}$ CNFET transistor; a grid of the $4^{th}$ CNFET transistor, a grid of the $5^{th}$ CNFET transistor and a drain of the $6^{th}$ CNFET transistor are connected to a drain of the $7^{th}$ CNFET transistor which forms a third connecting terminal, and the third connecting terminal is the $3^{rd}$ output terminal of the said ternary 1-3 line address decoder;

wherein a source of the $1^{st}$ CNFET transistor, a drain of the $2^{nd}$ CNFET transistor and a drain of the $3^{rd}$ CNFET transistor are connected to a drain of the $5^{th}$ CNFET transistor which forms a fourth connecting terminal, and the fourth connecting terminal is the $2^{nd}$ output terminal of the said ternary 1-3 line address decoder;

wherein a source of the $3^{rd}$ CNFET transistor is connected to a drain of the $4^{th}$ CNFET transistor;

wherein the two ternary 1-3 line decoders include a $1^{st}$ ternary 1-3 address decoder and a $2^{nd}$ ternary 1-3 line address decoder;

wherein the said nine three-input NAND gates include a $1^{st}$ three-input NAND gate, a $2^{nd}$ three-input NAND gate, a $3^{rd}$ three-input NAND gate, a $4^{th}$ three-input NAND gate, a $5^{th}$ three-input NAND gate, a $6^{th}$ three-input NAND gate, a $7^{th}$ three-input NAND gate, an $8^{th}$ three-input NAND gate and a $9^{th}$ three-input NAND gate;

wherein the said nine inverters include a $1^{st}$ inverter, a $2^{nd}$ inverter, a $3^{rd}$ inverter, a $4^{th}$ inverter, a $5^{th}$ inverter, a $6^{th}$ inverter, a $7^{th}$ inverter, an $8^{th}$ inverter and a $9^{th}$ inverter;

wherein the input terminal of the $1^{st}$ ternary 1-3 line address decoder is a $1^{st}$ input terminal of the said ternary 2-9 line address decoder; the input terminal of the $2^{nd}$ ternary 1-3 line address decoder is a $2^{nd}$ input terminal of the said ternary 2-9 line address decoder; the $1^{st}$ output terminal of the $1^{st}$ ternary 1-3 line address decoder is connected to the $2^{nd}$ input terminal of the $1^{st}$ three-input NAND gate, the $2^{nd}$ input terminal of the $2^{nd}$ three-input NAND gate and the $2^{nd}$ input terminal of the $3^{rd}$ three-input NAND gate respectively;

wherein the $2^{nd}$ output terminal of the $1^{st}$ ternary 1-3 line address decoder is connected to the $2^{nd}$ input terminal of the $4^{th}$ three-input NAND gate, the $2^{nd}$ input terminal of the $5^{th}$ three-input NAND gate and the $2^{nd}$ input terminal of the $6^{th}$ three-input NAND gate;

wherein the $3^{rd}$ output terminal of the $1^{st}$ ternary 1-3 line address decoder is connected to the $2^{nd}$ input terminal of the $7^{th}$ three-input NAND gate, the $2^{nd}$ input terminal of the $8^{th}$ three-input NAND gate and the $2^{nd}$ input terminal of the $9^{th}$ three-input NAND gate;

wherein the $1^{st}$ output terminal of the $2^{nd}$ ternary 1-3 line address decoder is connected to the $3^{rd}$ input terminal of the $1^{st}$ three-input NAND gate, the $3^{rd}$ input terminal of the $4^{th}$ three-input NAND gate and the $3^{rd}$ input terminal of the $7^{th}$ three-input NAND gate;

wherein the $2^{nd}$ output terminal of the $2^{nd}$ ternary 1-3 line address decoder is connected to the $3^{rd}$ input terminal of the $2^{nd}$ three-input NAND gate, the $3^{rd}$ input terminal of the $5^{th}$ three-input NAND gate and the $3^{rd}$ input terminal of the $8^{th}$ three-input NAND gate;

wherein the $3^{rd}$ output terminal of the $2^{nd}$ ternary 1-3 line address decoder is connected to the $3^{rd}$ input terminal of the $3^{rd}$ three-input NAND gate, the $3^{rd}$ input terminal of the $6^{th}$ three-input NAND gate and the $3^{rd}$ input terminal of the $9^{th}$ three-input NAND gate;

wherein the $1^{st}$ input terminal of the $1^{st}$ three-input NAND gate, the $1^{st}$ input terminal of the $2^{nd}$ three-input NAND gate, the $1^{st}$ input terminal of the $3^{rd}$ three-input NAND gate, the $1^{st}$ input terminal of the $4^{th}$ three-input NAND gate, the $1^{st}$ input terminal of the $5^{th}$ three-input NAND gate, the $1^{st}$ input terminal of the $6^{th}$ three-input NAND gate, the $1^{st}$ input terminal of the $7^{th}$ three-input NAND gate and the $1^{st}$ input terminal of the $8^{th}$ three-input NAND gate are connected to the $1^{st}$ input terminal of the $9^{th}$ three-input NAND gate which forms a fifth connecting terminal, and the fifth connecting terminal is an enabling terminal of the said ternary 2-9 line address decoder; the output terminal of the $1^{st}$ three-input NAND gate is connected to an input terminal of the $1^{st}$ inverter;

wherein the output terminal of the $2^{nd}$ three-input NAND gate is connected to an input terminal of the $2^{nd}$ inverter;

wherein the output terminal of the $3^{rd}$ three-input NAND gate is connected to an input terminal of the $3^{rd}$ inverter;

wherein the output terminal of the $4^{th}$ three-input NAND gate is connected to an input terminal of the $4^{th}$ inverter; the output terminal of the $5^{th}$ three-input NAND gate is connected to an input terminal of the $5^{th}$ inverter;

wherein the output terminal of the $6^{th}$ three-input NAND gate is connected to an input terminal of the $6^{th}$ inverter;

wherein an output terminal of the $7^{th}$ three-input NAND gate is connected to an input terminal of the $7^{th}$ inverter;

wherein an output terminal of the $8^{th}$ three-input NAND gate is connected to an input terminal of the $8^{th}$ inverter;

wherein an output terminal of the $9^{th}$ three-input NAND gate is connected to an input terminal of the $9^{th}$ inverter;

wherein an output terminal of the $1^{st}$ inverter is a $1^{st}$ output terminal of the said ternary 2-9 line address decoder;

wherein an output terminal of the $2^{nd}$ inverter is a $2^{nd}$ output terminal of the said ternary 2-9 line address decoder; an output terminal of the $3^{rd}$ inverter is a $3^{rd}$ output terminal of the said ternary 2-9 line address decoder;

wherein an output terminal of the $4^{th}$ inverter is a $4^{th}$ output terminal of the said ternary 2-9 line address decoder;

wherein an output terminal of the $5^{th}$ inverter is a $5^{th}$ output terminal of the said ternary 2-9 line address decoder;

wherein an output terminal of the $6^{th}$ inverter is a $6^{th}$ output terminal of the said ternary 2-9 line address decoder;

wherein an output terminal of the $7^{th}$ inverter is a $7^{th}$ output terminal of the said ternary 2-9 line address decoder;

wherein an output terminal of the $8^{th}$ inverter is an $8^{th}$ output terminal of the said ternary 2-9 line address decoder;

wherein an output terminal of the $9^{th}$ inverter is a $9^{th}$ output terminal of the said ternary 2-9 line address decoder.

2. The ternary 2-9 line address decoder realized by CNFET according to claim 1, wherein a threshold voltage of the $1^{st}$ CNFET transistor is 0.428 v; a threshold voltage of the $2^{nd}$ CNFET transistor and the $5^{th}$ CNFET transistor is 0.557 v; a threshold voltage of the $3^{rd}$ CNFET transistor and the $4^{th}$ CNFET transistor is −0.557 v; a threshold voltage of the $6^{th}$ CNFET transistor and the $9^{th}$ CNFET transistor is 0.289 v; a threshold voltage of the $7^{th}$ CNFET transistor and the $8^{th}$ CNFET transistor is −0.557 v; a threshold voltage of the $10^{th}$ CNFET transistor is −0.289 v; a threshold voltage of the $11^{th}$ CNFET transistor is 0.557 v.

3. The ternary 2-9 line address decoder realized by CNFET according to claim 1, wherein a caliber of the $1^{st}$ CNFET transistor is 1.018 nm; a caliber of the $2^{nd}$ CNFET transistor, the $3^{rd}$ CNFET transistor, the $4^{th}$ CNFET transistor, the $5^{th}$ CNFET transistor, the $7^{th}$ CNFET transistor, the $8^{th}$ CNFET transistor and the $11^{th}$ CNFET transistor is 0.783 nm; a caliber of the $6^{th}$ CNFET transistor and the $9^{th}$ CNFET transistor is 1.487 nm; and a caliber of the $10^{th}$ CNFET transistor is 1.488 nm.

4. The ternary 2-9 line address decoder realized by CNFET according to claim 1, wherein the $1^{st}$ power source is 0.9 v; and the $2^{nd}$ power source is 0.45 v.

5. The ternary 2-9 line address decoder realized by CNFET according to claim 1, wherein each of the said three-input NAND gate comprises a $12^{th}$ CNFET transistor, a $13^{th}$ CNFET transistor, a $14^{th}$ CNFET transistor, a $15^{th}$ CNFET transistor, a $16^{th}$ CNFET transistor, a $17^{th}$ CNFET transistor and an $18^{th}$ CNFET transistor; wherein the $12^{th}$ CNFET transistor, the $16^{th}$ CNFET transistor and the $17^{th}$ CNFET transistor are P CNFET transistors; the $13^{th}$ CNFET transistor, the $14^{th}$ CNFET transistor, the $15^{th}$ CNFET transistor and the $18^{th}$ CNFET transistor are N CNFET transistors;

wherein a source of the $12^{th}$ CNFET transistor, a source of the $16^{th}$ CNFET transistor, a source of the $17^{th}$ CNFET transistor and a grid of the $18^{th}$ CNFET transistor are connected to the $1^{st}$ power source;

wherein a drain of the $18^{th}$ CNFET transistor is connected to the $2^{nd}$ power source;

wherein a grid of the $12^{th}$ CNFET transistor is connected to a grid of the $13^{th}$ CNFET transistor which forms a sixth connecting terminal, and the sixth connecting terminal is the $1^{st}$ input terminal of the said three-input NAND gate;

wherein a drain of the $12^{th}$ CNFET transistor, a drain of the $13^{th}$ CNFET transistor, a drain of the $16^{th}$ CNFET transistor and a drain of the $17^{th}$ CNFET transistor are connected to a source of the $18^{th}$ CNFET transistor which forms a seventh connecting terminal, and the seventh connecting terminal is the output terminal of the said three-input NAND gate;

wherein a source of the $13^{th}$ CNFET transistor is connected to a drain of $14^{th}$ CNFET transistor;

wherein a source of the $14^{th}$ CNFET transistor is connected to a drain of the $15^{th}$ CNFET transistor;

wherein a grid of the $14^{th}$ CNFET transistor is connected to a grid of the $16^{th}$ CNFET transistor which forms an eighth connecting terminal, and the eighth connecting terminal is the $2^{nd}$ input terminal of the said three-input NAND gate; a source of the $15^{th}$ CNFET transistor is grounded; and wherein a grid of the $15^{th}$ CNFET transistor is connected to a grid of the $17^{th}$ CNFET transistor which forms a ninth connecting terminal, and the ninth connecting terminal is the $3^{rd}$ input terminal of the said three-input NAND gate.

6. The ternary 2-9 line address decoder realized by CNFET according to claim 5, wherein a caliber of the $12^{th}$ CNFET transistor, the $13^{th}$ CNFET transistor, the $14^{th}$ CNFET transistor, the $15^{th}$ CNFET transistor, the $16^{th}$ CNFET transistor and the $17^{th}$ CNFET transistor is 0.783 nm; a caliber of the $18^{th}$ CNFET transistor is 1.018 nm.

7. The ternary 2-9 line address decoder realized by CNFET according to claim 1, wherein each of the said inverters comprises a $19^{th}$ CNFET transistor, a $20^{th}$ CNFET transistor and a $21^{st}$ CNFET transistor; wherein the $19^{th}$ CNFET transistor is P CNFET transistor; the $19^{th}$ CNFET transistor and the $20^{th}$ CNFET transistor are N CNFET transistors;

wherein a source of the $19^{th}$ CNFET transistor and a grid of the $21^{st}$ CNFET transistor are connected to the $1^{st}$ power source;

wherein a drain of the $21^{st}$ CNFET transistor is connected to the $2^{nd}$ power source;

wherein a grid of the $19^{th}$ CNFET transistor is connected to a grid of the $20^{th}$ CNFET transistor which forms a tenth connecting terminal, and the tenth connecting terminal is an input terminal of the said inverter; and a drain of the $19^{th}$ CNFET transistor and a drain of the $20^{th}$ CNFET transistor are connected to a source of the $21^{st}$ CNFET transistor which forms an eleventh connecting terminal, and the eleventh connecting terminal is an output terminal of the said inverter; a source of the $20^{th}$ CNFET transistor is grounded.

8. The ternary 2-9 line address decoder realized by CNFET according to claim 1, wherein a caliber of the $19^{th}$ CNFET transistor and the $20^{th}$ CNFET transistor is 0.783 nm; and a caliber of the $21^{st}$ CNFET transistor is 1.018 nm.

* * * * *